United States Patent [19]

Blazo

[11] Patent Number: 4,995,044
[45] Date of Patent: Feb. 19, 1991

[54] LASER DIODE IMPULSE CIRCUIT
[75] Inventor: Stephen F. Blazo, Portland, Oreg.
[73] Assignee: Tektronix, Inc., Beaverton, Oreg.
[21] Appl. No.: 498,177
[22] Filed: Mar. 23, 1990
[51] Int. Cl.$^5$ .............................................. H01S 3/10
[52] U.S. Cl. ...................................... 372/25; 372/38; 372/33
[58] Field of Search ............................ 372/25, 33, 38

[56] References Cited
U.S. PATENT DOCUMENTS

| | | | |
|---|---|---|---|
| 4,601,037 | 6/1986 | McDonald | 372/38 |
| 4,647,792 | 3/1987 | Meslener et al. | 372/38 |
| 4,736,380 | 4/1988 | Agoston | 372/38 |
| 4,928,248 | 5/1990 | Takahashi et al. | 372/38 |

Primary Examiner—Frank Gonzalez
Assistant Examiner—Susan S. Morse
Attorney, Agent, or Firm—Francis I. Gray; William K. Bucher

[57] ABSTRACT

A laser diode impulse circuit has a normally forward biased step recovery diode coupled to the output of a current pulse generating circuit. An inductor in parallel with a series combination of a pulse shaping network and a laser diode is coupled to the output of the step recovery diode. When the step recovery diode becomes reverse biased in response to a current pulse from the current pulse generating circuit, energy is stored in the inductor. The stored energy is then transferred from the inductor to the laser diode via the pulse shaping network to produce an optical pulse having a desired shape.

2 Claims, 2 Drawing Sheets

LASER DIODE IMPULSE CIRCUIT

BACKGROUND OF THE INVENTION

The present invention relates to laser driver circuits, and more particularly to a laser diode impulse circuit that provides a failsafe feature against single point failures and suppresses noise in a current source for the laser diode.

Short duration optical pulses are desirable in many applications, such as photodiode risetime testing, high resolution time domain reflectometry and dispersion and bandwidth testing on optical fiber. Pulse durations of less than forty picoseconds are sometimes desired. To achieve such short duration pulses a laser drive circuit is desired that can produce a very short impulse current pulse. One such circuit is described in U.S. Pat. No. 4,736,380 issued on Apr. 5, 1988 to Agoston Agoston entitled "Laser Diode Driver." In that circuit a reverse current transmitted through an initially forward biased step recovery diode causes the step recovery diode to switch from the forward biased state to a reverse biased state that develops an abruptly rising reverse bias voltage across the step recovery diode. The abruptly rising reverse bias voltage is applied across a series combination of a capacitor and a laser diode connected in parallel with the step recovery diode to force a short, abrupt forward current pulse through the laser diode. In response to the current pulse the laser diode emits a short optical pulse.

The current applied to the step recovery diode is generated by a current source to which an impulse trigger is applied. Due to the complicated nature of the drive circuit with numerous resonating elements, when the current reverses a considerable amount of transients and noise are generated, which transients and noise appear in the short current pulse that is applied to the laser diode. This "trash" results in an undesirable optical pulse shape from the laser diode. Another problem occurs if the capacitor shorts, in which case the current is applied continuously to the laser diode so that the laser diode operates in a continuous wave mode, resulting in a safety hazard due to the laser beam power being at a level that could cause eye damage, i.e., Class III Laser.

What is desired is a laser diode impulse circuit that eliminates single point failures that result in the abatement of laser safety hazards to Class I operation, and that produces a clean, predictable output optical pulse.

SUMMARY OF THE INVENTION

Accordingly the present invention provides a laser diode impulse circuit that has a current source and bias network, the output of which is applied to a step recovery diode. A series combination of a pulse shaping network and a laser diode in parallel with an inductor is coupled in series with the step recovery diode. The inductor acts as an energy storage device so that when the step recovery diode is reverse biased, the current pulse applied to the laser diode is supplied by the inductor without the transients and noise associated with the output of the current source. Additionally the inductor acts to shunt any current that occurs due to single point failures to ground, preventing such current to drive the laser diode in a continuous wave mode.

The objects, advantages and novel features of the present invention are apparent from the following detailed description when read in conjunction with the appended claims and attached drawing.

DESCRIPTION OF THE PREFERRED EMBODIMENT

Figures 1, 3:
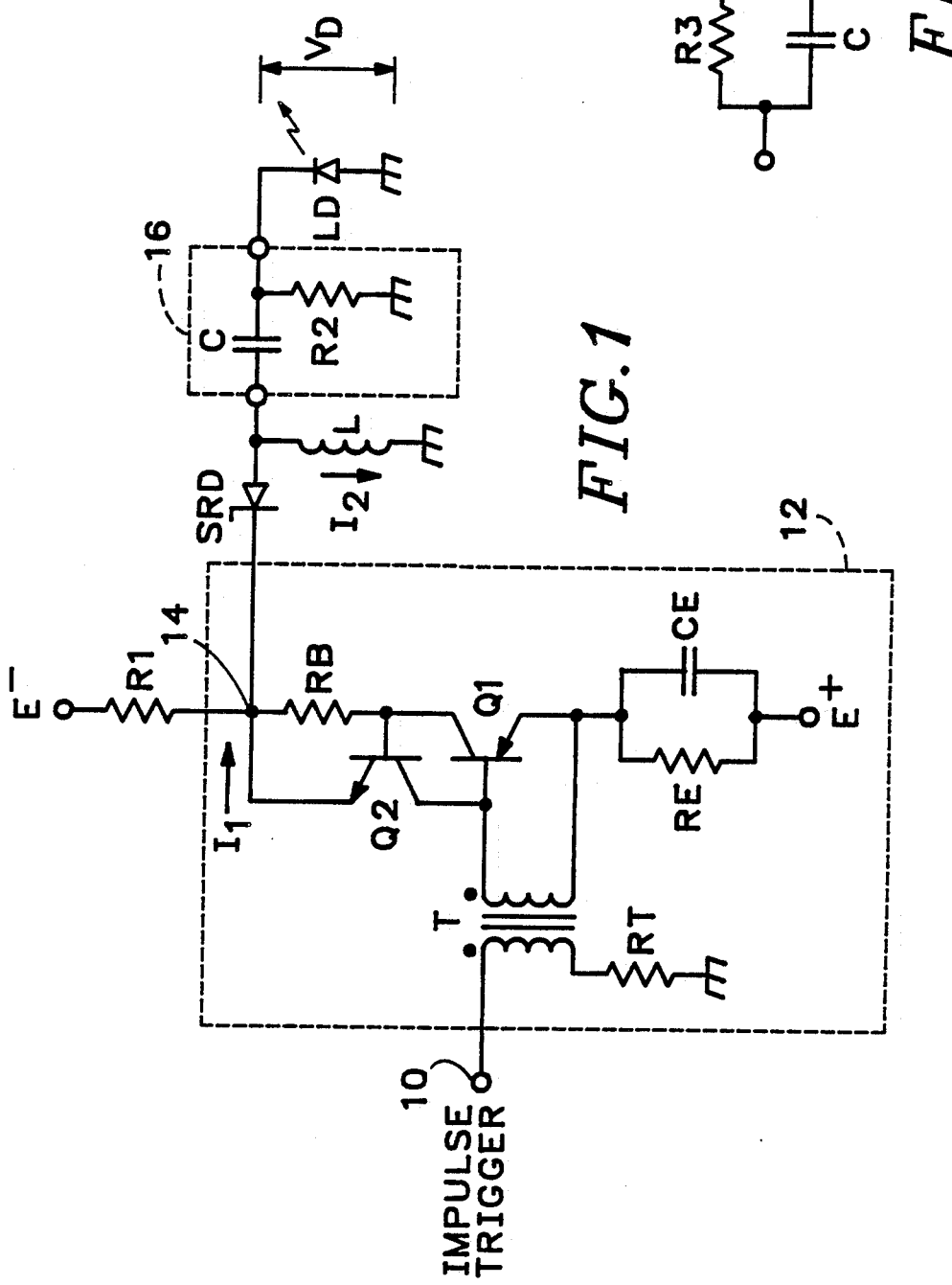
FIG. 1 is a circuit diagram of a laser diode impulse circuit according to the present invention.
FIG. 3 is a circuit diagram of an alternative pulse shaping network for the circuit of FIG. 1.
Figure 2:
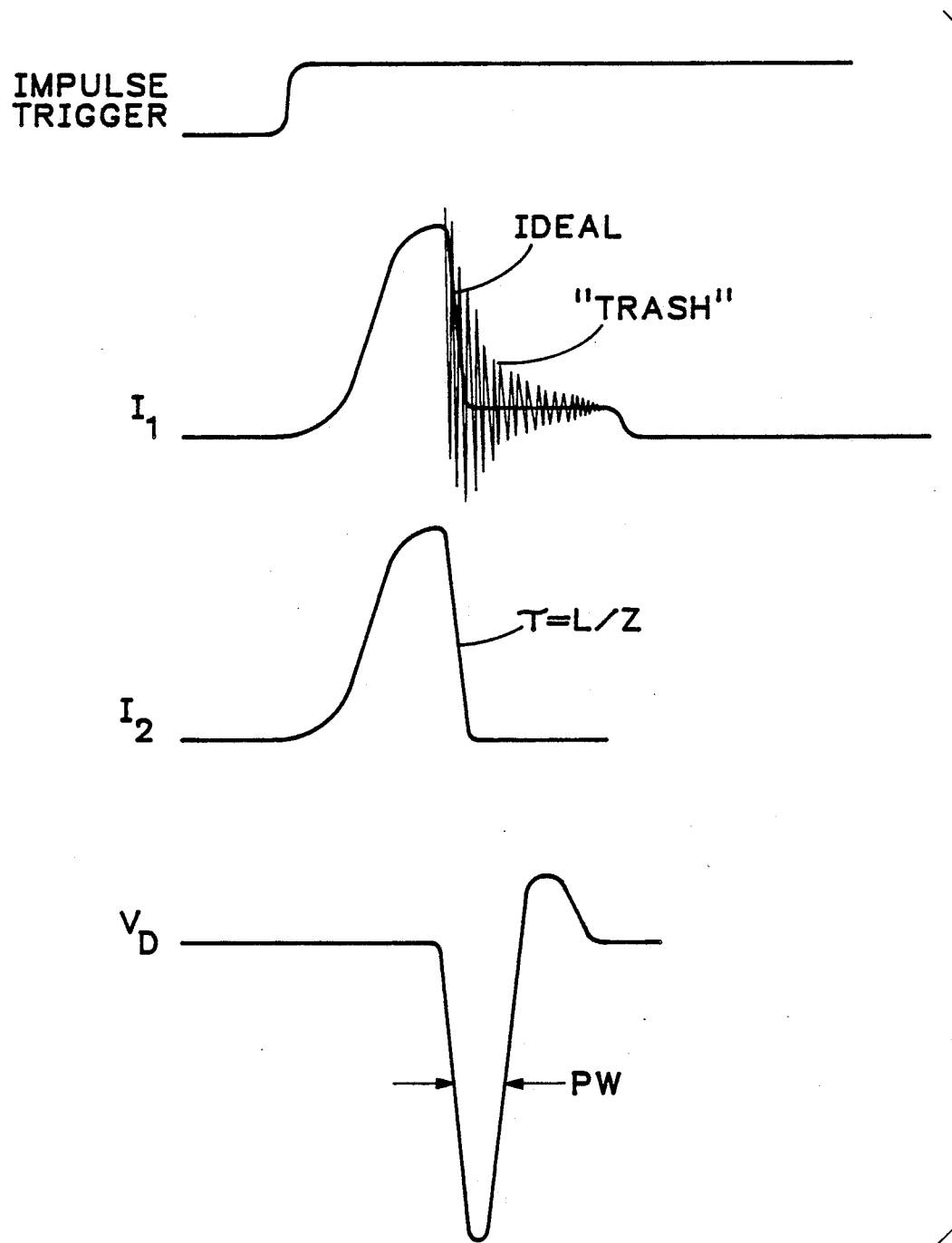
FIG. 2 is a waveform diagram for the laser diode impulse circuit of FIG. 1.

Referring now to FIG. 1 an impulse trigger is applied at an input terminal 10. The impulse trigger is coupled from the input terminal 10 via a transformer T to the base of a transistor Q1 in a current pulse source circuit 12. The output of the current pulse source circuit 12 is taken from the emitter of transistor Q2 at node 14, the transistor Q2 being coupled across the base-collector of transistor Q1. A current pulse in the transformer T causes regeneration in transistors Q1, Q2, bringing them rapidly into saturation. The cathode of a step recovery diode SRD is coupled to the node 14. At the anode of step recovery diode SRD is coupled an inductor L, the other end of which is returned to ground, and a series combination of a pulse shaping network 16 and a laser diode LD, the anode of which is coupled to ground. The pulse shaping network 16 may be a simple RC network as shown, or any other network of resistors, capacitors and inductors, such as shown in FIG. 3, that produces the desired output optical pulse shape.

In operation the step recovery diode SRD is normally forward biased by a resistor R1 coupled between a negative voltage rail E- and the cathode of the step recovery diode. The anode of the step recovery diode SRD is effectively at ground since the inductor L is essentially a short circuit to ground at D.C. When the impulse trigger causes the transistors Q1, Q2 to saturate, a current pulse $I_1$ from the emitter of Q2 rapidly depletes the charge on the step recovery diode SRD resulting in storage of energy in the inductor L as indicated by a current $I_2$. When the charge is depleted the step recovery diode SRD acts as an open switch, disconnecting the current impulse source circuit 12 from the laser diode LD. The energy stored in the inductor L is then transferred via the pulse shaping network 16 to the laser diode LD free of any "trash" associated with the current pulse $I_1$.

For any failure modes that would produce a steady current applied to the laser diode LD, such currents are shunted to ground by the inductor L. Therefore it would take at least the failure of two components, one of which being the inductor L, before the laser diode LD could be put into a continuous wave mode of operation.

Thus the present invention provides a laser diode impulse circuit that has an inductor coupled in parallel with a series combination of a pulse shaping network and a laser diode, the inductor storing energy during the reverse biasing of a step recovery diode in response to an input current pulse and then discharging the energy through the laser diode, the inductor serving to eliminate catastrophic single point failures and to present a clean current pulse to the laser diode.

What is claimed is:

1. A laser diode impulse circuit comprising:

a current pulse generating circuit for generating a current pulse in response to an input trigger signal;

a step recovery diode coupled to the output of the current pulse generating circuit, the step recovery diode being normally forward biased with the current pulse causing the step recovery diode to become reverse biased;

an inductor coupled in series with the step recovery diode opposite of the current pulse generating circuit to store energy when the step recovery diode is reverse biased;

a pulse shaping network coupled in series with a laser diode, the series combination in turn being coupled in parallel with the inductor, so that the energy stored in the inductor is transferred to the laser diode in the form of a short current pulse to produce an optical pulse.

2. A laser diode impulse circuit comprising:

a step recovery diode;

means coupled to the cathode of the step recovery diode for switching the step recovery diode from a forward biased state to a reverse biased state in response to a trigger signal;

means coupled to the anode of the step recovery diode for storing energy when the step recovery diode is in the reverse biased state; and a pulse shaping network coupled between the anode of the step recovery diode and the cathode of a laser diode for transferring the energy from the storing means to the laser diode to produce an optical pulse.

* * * * *